(12) United States Patent
Paik et al.

(10) Patent No.: US 6,930,399 B2
(45) Date of Patent: Aug. 16, 2005

(54) HIGH RELIABILITY NON-CONDUCTIVE ADHESIVES FOR NON-SOLDER FLIP CHIP BONDINGS AND FLIP CHIP BONDING METHOD USING THE SAME

(75) Inventors: Kyung-Wook Paik, Taejon (KR); Myung-Jin Yim, Taejon (KR)

(73) Assignees: Korea Advanced Institute of Science and Technology (KR); Telephus Inc. (KR)

( * ) Notice: Subject to any disclaimer, the term of this patent is extended or adjusted under 35 U.S.C. 154(b) by 123 days.

(21) Appl. No.: 10/343,519
(22) PCT Filed: Aug. 2, 2001
(86) PCT No.: PCT/KR01/01313
§ 371 (c)(1),
(2), (4) Date: Jan. 30, 2003
(87) PCT Pub. No.: WO02/15259
PCT Pub. Date: Feb. 21, 2002

(65) Prior Publication Data
US 2003/0143797 A1 Jul. 31, 2003

(30) Foreign Application Priority Data
Aug. 2, 2000 (KR) .......................................... 2000-44829

(51) Int. Cl.$^7$ .............................................. H01L 23/48
(52) U.S. Cl. ......................................... 257/783; 257/778
(58) Field of Search .................................. 257/783, 778

(56) References Cited

U.S. PATENT DOCUMENTS

| | | | |
|---|---|---|---|
| 5,863,970 A | | 1/1999 | Ghoshal et al. |
| 5,976,699 A | * | 11/1999 | Hosomi et al. ............. 428/418 |
| 6,121,070 A | | 9/2000 | Akram |
| 6,409,866 B1 | * | 6/2002 | Yamada ...................... 156/219 |
| 6,447,915 B1 | * | 9/2002 | Komiyatani et al. ........ 428/416 |

FOREIGN PATENT DOCUMENTS

| | | |
|---|---|---|
| KR | 1997-0061017 | 8/1997 |
| KR | 1020000046722 | 7/2000 |

OTHER PUBLICATIONS

English language abstract of Korean Patent Publication No. 1020000046722.
English language abstract of Korean Patent Publication No. 1997–0061017.

* cited by examiner

Primary Examiner—David Nelms
Assistant Examiner—Quoc Hoang
(74) Attorney, Agent, or Firm—Marger Johnson & McCollom, P.C.

(57) ABSTRACT

The method of the present invention comprises the steps of: providing an IC chip having I/O pads, each having a non-solder bump such as Au or Cu stud bump or Ni\Cu\Au bump formed thereon, and a substrate having metal electrodes formed thereon; applying a film-type non-conductive adhesive (NCA) to the chip or substrate, the adhesive including solid-phase bisphenol A type epoxy resin, liquid-phase bisphenol F type epoxy resin, solid-phase phenoxy resin, methylethylketone/toluene solvent, liquid-phase hardener, and non-conductive particles; and thermo-compressing the IC chip to the substrate so that the non-solder bump and the metal electrode can be mechanically and electrically connected. The NCA of the present invention has high reliability since it has lower thermal expansion coefficient and dielectric constant than conventional NCAs and has excellent mechanical and electrical characteristics. In addition, the NCA can be effectively selected at need and applied to diverse processes since it can be made to a form of paste rather than film. The method of the present invention is harmless to the environment since it does not employ conventional solder bumps using solder as a chief ingredient.

7 Claims, 7 Drawing Sheets

HIGH RELIABILITY NON-CONDUCTIVE ADHESIVES FOR NON-SOLDER FLIP CHIP BONDINGS AND FLIP CHIP BONDING METHOD USING THE SAME

TECHNICAL FIELD

The present invention relates to a non-conductive adhesive (hereinafter referred to NCA) and a method for flip chip bonding using the same. Especially the present invention relates to a non-conductive adhesive with smaller coefficient of thermal expansion and dielectric constant and superior mechanical and electrical features compared to conventional NCA and a method for flip chip bonding using the same.

BACKGROUND ART

The electronic packaging technology is a comprehensive and diverse system manufacturing technology including all steps from a semiconductor device to a final finished product. Recently, the technologies in semiconductor are developing into integration of more than million cells, and large number of I/O pins, large size die, dissipation of large amount of heat and high electrical performance in case of a non-memory device. However, the electronic packaging technology for such devices has not followed the rapid development of semiconductor industry.

The electronic packaging technology is an important technology that affects performance, size, price and reliability of final electronic products. The importance of this technology is being emphasized according to the development of electronic products pursuing high electric performance, ultra small size/high density, low power, multi-function, high speed signal processing and permanent reliability.

In line on the trend, the flip chip bonding technology, one of the technologies that connect a chip to a substrate electrically has drawn a lot of attention. However, the flip chip bonding technology involves complex bonding processes utilizing a existing solder comprising coating of solder flux on a substrate, aligning a chip which is formed of a solder bump and a substrate which is formed of a surface electrode, reflowing of a solder bump, removing of remained flux, filling of underfill and hardening. So this technology increases the price of final products.

Therefore, in order to simplify the aforementioned complex process, a packaging technology in a wafer state which coats and processes polymeric material with flux and underfill functions in a wafer state draws attention. In addition a study on a flip chip bonding technology using a conductive adhesive is in progress. The conductive adhesive has advantages of low price compared to a general solder flip chip, possibility of ultrafine electrode pitch, environmental friendliness due to not using flux or lead components, and processibility at low temperature.

The conductive adhesive can be divided into an anisotropic conductive adhesive (hereinafter referred to ACA) and an isotropic conductive adhesive, and comprises: conductive particles such as Ni, Au/polymer or Ag; and thermosetting, thermoplastic or blend type insulating resin integrating advantages of them. The research on flip chip technology utilizing expensive but environmentally friendly ACA as a connection material has been very active. In order to support the research the development of ACA material and application of ACA flip chip technology have been also very popular.

In addition to the flip chip bonding technology using the conductive adhesive, the technology using NCA that does not have conductive particles is introduced. However, there has been a problem of low reliability for conventional NCA material because it exhibits a large coefficient of thermal expansion and dielectric constant and also has inferior mechanical and electrical features.

As explained above, since it uses solder bump, existing flip chip packaging technology is not only complicated in its assembly process, but also not environmentally friendly. And packaging cost is high due to the cost of ACA material when ACA is used. When NCA is used, reliability of the product is lowered because of large coefficient of thermal expansion and dielectric constant and its inferior mechanical and electrical features. Considering the reality that electronic packaging technology is on the rise as an important field in creating added value of products, it is a very important task to develop environmental friendly flip chip technology that solves the existing problems and can substitute existing solder connection.

DISCLOSURE OF THE INVENTION

Therefore, it is the object of this invention to provide NCA for flip chip bonding that is less expensive than ACA but with smaller coefficient of thermal expansion and dielectric constant and with superior mechanical and electrical features and high reliability compared to conventional NCA.

It is another object of this invention to provide a method for flip chip bonding that is environmentally friendly and can increase the reliability of product using the NCA provided by this invention, using gold or copper stud bump instead of solder bump, and using non-solder bump such as electroless nickel/copper/gold bump.

One example of non-conductive adhesive used for flip chip bonding in this invention is in the form of a film comprising solid-phase bisphenol A type epoxy resin, liquid-phase bisphenol F type epoxy resin, solid-phase phenoxy resin, methylethylketone/toluene solvent, a liquid-phase hardener, and non-conductive particles. It is desirable that the thickness of film is 10~50 micrometers ($\mu$m) and an extra layer of epoxy resin on both sides of the film with the thickness of 2~5 $\mu$m is added to enhance the adhesion.

Another example of non-conductive adhesive used for flip chip bonding in this invention is in the form of a paste comprising liquid-phase bisphenol A or F type epoxy resin, liquid-phase hardener, and non-conductive particle.

In the examples of non-conductive adhesive used for flip chip bonding in this invention, the non-conductive particle has the size of 0.1~1 $\mu$m and are comprised of $SiO_2$ or SiC. The hardener is an imidazole type hardener. Also, the hardener is 15~30 wt % of the epoxy resin and the non-conductive particle is 10~30 wt % of the whole non-conductive adhesive.

A method for flip chip bonding according to one example of this invention comprises steps of: preparing an IC chip that multiple number of non solder bumps are formed at the I/O stage and a board that metal electrode is formed on the surface; gluing the non conductive adhesive according to one example of the present invention on the substrate; aligning the bump on the metal electrode; and thermo-compressing the IC chip to the board so that the bump is plastic deformed and the bump and the metal electrode are connected mechanically and electrically.

A method for flip chip bonding according to another example of in this invention comprises steps of: preparing an IC chip that multiple number of non solder bumps are formed at the I/O stage and a board that metal electrode is formed on the surface; coating the non-conductive adhesive according to another example of the present invention on the substrate; aligning the bump on the metal electrode; and thermo-compressing the IC chip to the board so that the bump is plastic deformed and the bump and the metal electrode are connected mechanically and electrically.

In one or another method for flip chip bonding in this invention, the step that forms the non-solder bump comprises: forming a metal pad at the I/O stage of IC chip; and forming a gold or copper stud bump on the metal pad.

Here, after the stud bump formation step, it is desirable that a coining process that applies the pressure to the end of stud bump is added so that the end of stud bump becomes even. Whether coining process needs to be added or not is decided upon the strength of the stud bump material and its plastic deformation characteristics. Normally coining process is not necessary for gold stud bump, however, is better to be added for copper stud bump.

In one or another method for flip chip bonding in this invention, the step that forms the non-solder bump comprises: forming a metal pad at the I/O stage of IC chip; and forming nickel/copper/gold bump by adding nickel, copper, and gold layer successively to the metal pad in a electroless method. Copper is less hard than nickel and is easily plastically deformed, therefore, nickel/copper bump is electrically connected to metal electrode of the board stably. In this way, the said copper layer is formed.

Meanwhile, depending on the case, zincate treatment on the metal pad can be added after the formation of the metal pad.

BEST MODE FOR CARRYING OUT THE INVENTION

Explanation on an example of the present invention referring to the attached drawings follows.

[Bump Formation of IC Chip for a Test]

Figure 1A:
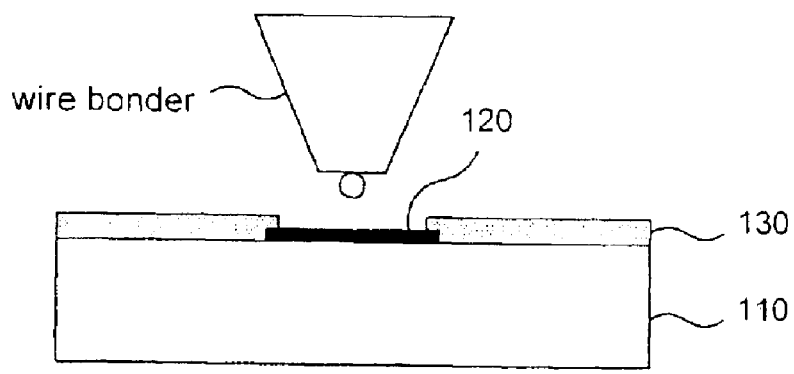
FIG. 1A to FIG. 1C are schematic drawings to describe the method of formation of gold stud bump 140 before coining.
Figure 1B:
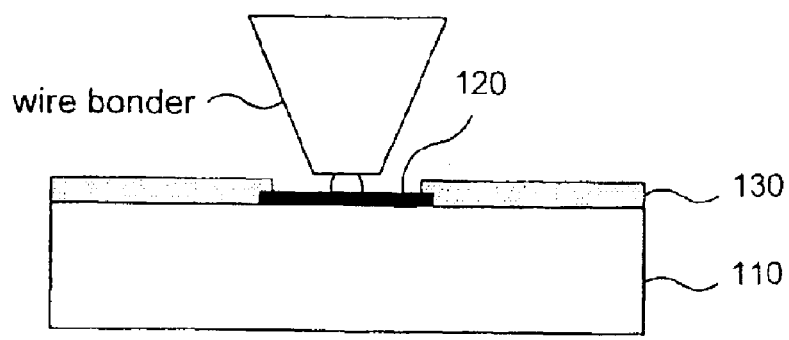
Figure 1C:
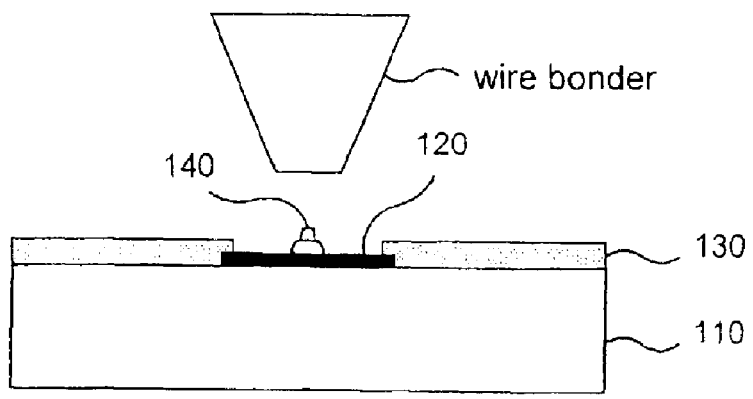
Figure 1D:
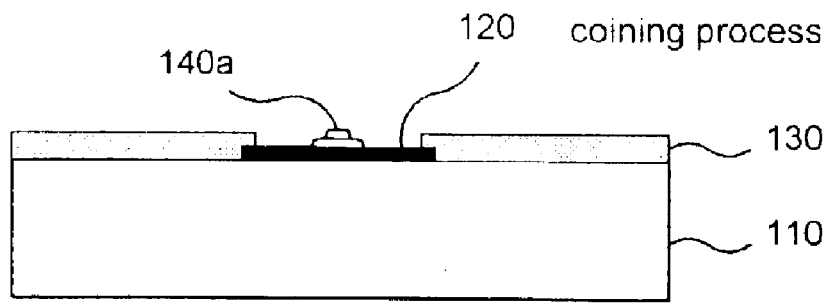
FIG. 1D is a sketch to describe the method of formation of gold stud bump 140a that the end of which becomes even by coining process.

FIG. 1A through FIG. 1C are sketches to describe the method of formation of gold stud bump 140 before coining and FIG. 1D is a sketch to describe the method of formation of gold stud bump 140a that the end of which becomes even by coining process.

Referring to FIG. 1A through 1D, aluminum pad 120 is deposited to IC chip 110 with the thickness of 1 $\mu$m first. Then, after protection film 130 comprised of SiN or polyamide is formed on an aluminum pad 120 in 0.5~1 $\mu$m thickness, I/O pad is formed following from the formation of pitch with 100 $\mu$m diameter that reveals aluminum pad 120 by etching the protection film 130.

Then, gold stud bump 140 is formed using wire bonder above the I/O pad. Since the end of gold stud bump 140 has a bit sharp shape, gold stud bump 140a, the end of it is evened by performing the coining process that applies the constant pressure to the end of gold stud bump 140.

The coining process is performed to ease the alignment and contact of the IC chip 110 with the board as well as to reduce the contact resistance by widening the contact area. Another reason to perform the coining process is to prevent the damage of IC chip from an over contact pressure to a specific I/O pad in contact with the board if the height of the bump is uneven.

Figure 1E:
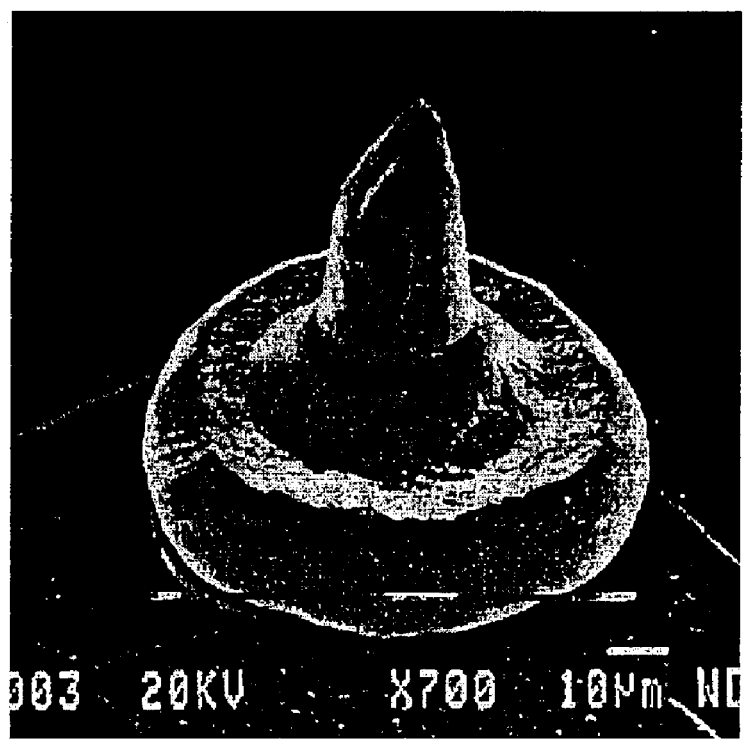
FIG. 1E is a picture that shows the gold stud bump 140 of FIG. 1C before coining.
Figure 1F:
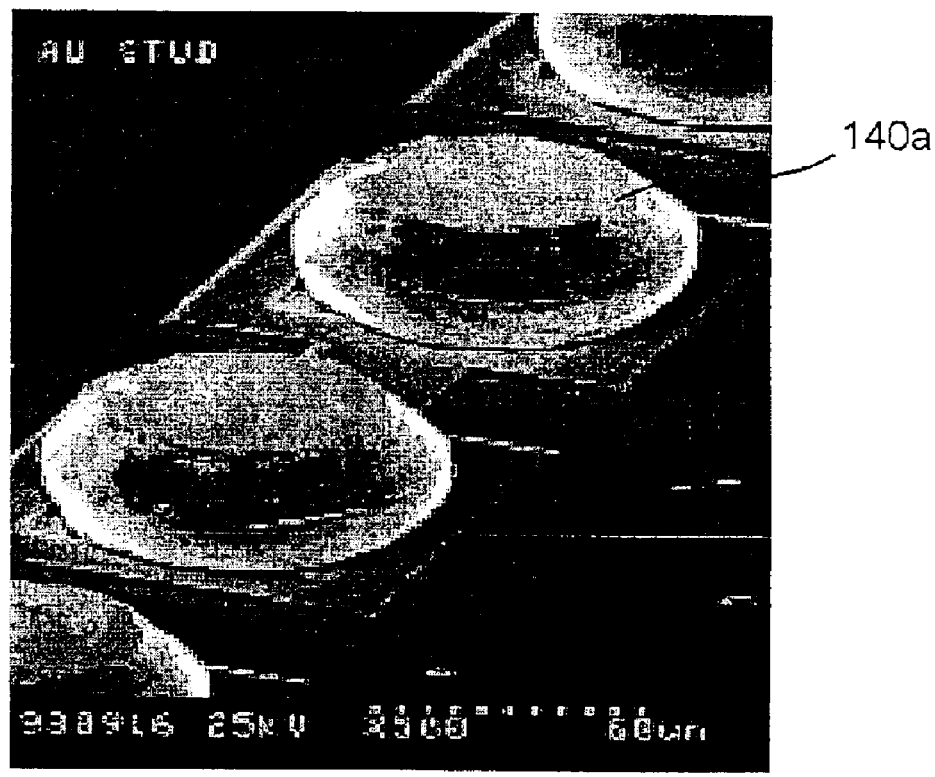
FIG. 1F is a picture that shows the gold stud bump 140a of FIG. 1D after coining.

The same process is conducted in case that a copper stud bump is used instead of a gold bump. FIG. 1E is a picture that shows the gold stud bump 140 of FIG. 1C before coining and FIG. 1F is a picture that shows the gold stud bump 140a of FIG. 1D after coining.

FIG. 2A through FIG. 2D are cross-sectional views to describe the method of formation of electroless nickel/copper/gold bump. Referring to FIG. 2A through 2D, I/O pad is formed as in FIG. 1A, except that a zinc layer 125 is formed by zincate treatment after aluminum pad 120 is formed to activate aluminum for metal coating. That is, after aluminum pad is formed in 2 $\mu$m thickness by sputtering method, either SiN protection film is deposited in 0.5 $\mu$m thickness by thermal evaporation or polyimid organic protection film in 1 $\mu$m thickness by spin coating method, and I/O pad is formed applying lithography process.

Next, nickel layer 142 of 10~15 $\mu$m thickness is formed after dipping the result material in a electroless nickel coating solution of 90° C. for 20~30 minutes. After electroless copper coating solution 144 that is less hard than nickel coating one is formed in 10 $\mu$m thickness, a gold layer 146 of 0.1 $\mu$m thickness is formed by gold coating for 30 minutes using electroless gold coating solution around 60° C. Therefore, electroless nickel/copper/gold bump 145 is approximately 25 $\mu$m in thickness as a whole.

Figure 2A:
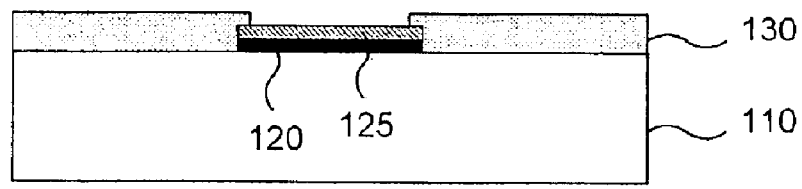
FIG. 2A to FIG. 2D are cross-sectional views to describe the method of formation of electroless nickel/copper/gold bump.
Figure 2B:
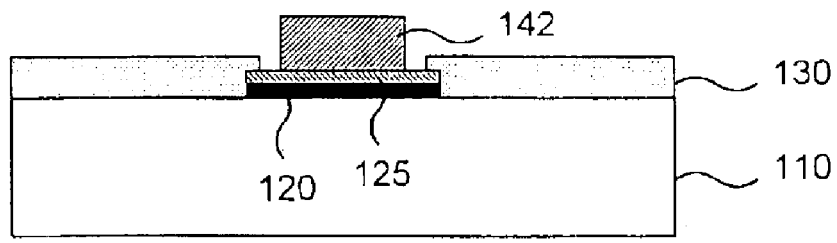
Figure 2C:
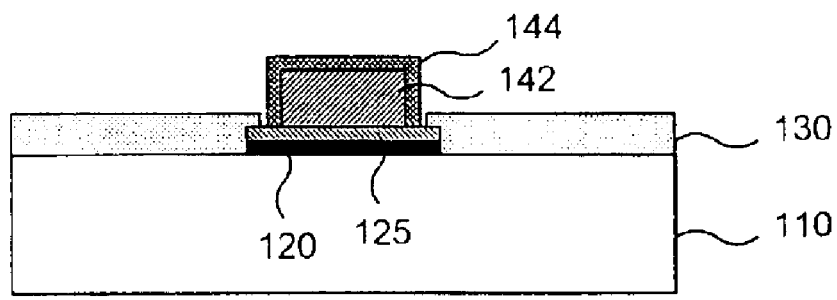
Figure 2D:
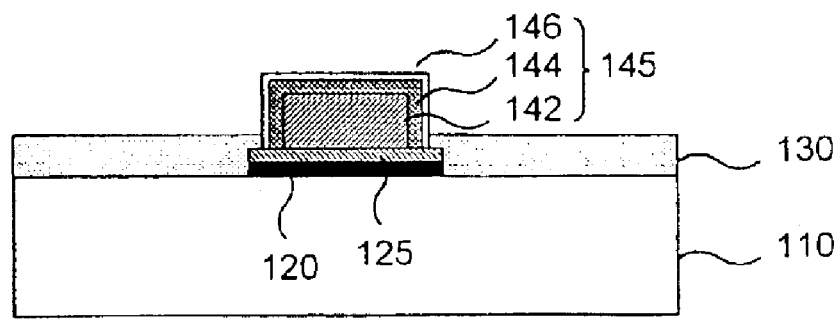
Figure 2E:
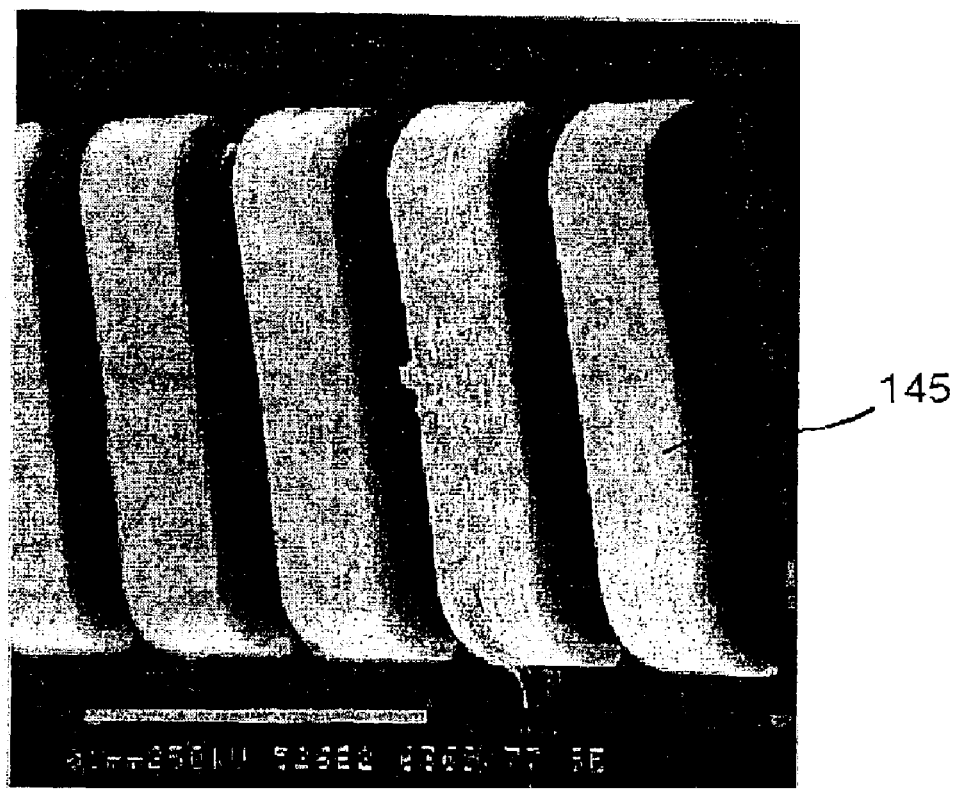
FIG. 2E is a picture to show electroless nickel/copper/gold bump of FIG. 2D.

The use of gold layer 146 is to protect the nickel layer 142 and copper layer 144 from oxidation and to increase the electric conductivity as well. The copper layer 144 with good ductility that lies between nickel layer 142 and gold layer, is making the plastic deformation easier when IC chip 110 is thermo-compressed to the board and widens the electric contact area as a result. FIG. 2E is a picture to show electroless nickel/copper/gold bump of FIG. 2D.

[Making Board for a Test]

A FR-4 organic board in 1 mm thickness is made for a test board. The surface of the board is formed with a metal electrode comprising of multiple layer of Ni/Cu/Au, and the part outside the electrode is protected by solder mask.

[Making NCA]

NAC in the form of a film or a paste is made mixing epoxy resin, hardener, and non-conductive particles.

NCA film is produced as follows. 10 g of solid-phase bisphenol A type epoxy resin, 25 g of liquid-phase bisphenol F type epoxy resin, 20 g of solid-phase phenoxy resin, 46.6 g of solvent mixture of methylethylketone and toluene with the ratio of 1:3 in vol % (corresponding to 10.8 g of methylethylketone and 35.8 g of toluene), 15 g of liquid-phase imidazole type hardener, and non-conductive particles comprising of SiO2 and SiC with the size of 0.1~1 $\mu$m and with smaller thermal expansion coefficient and dielectric constant are mixed together.

The component materials of the NCA film are listed above in specific weight amounts. The NCA film is effective when the component materials are used in the following ranges of percentage weight of the film. The solid phase bisphenol A type epoxy resin can be 6–10 wt %. The liquid-phase bisphenol F type epoxy resin can be 15–25 wt %. The solid-phase phonxy resin can be 12–18 wt %. The solvent mixture with methylethylketone and toluene with ration of 1:3 in vol % can be 32–40 wt %. The liquid-phase imidazole hardener can be 8–14 wt %. And the non-conductive SiO2 or SiC particles can be 6–20 wt %.

A Mechanical mixer is used for mixing and solid-phase bisphenol A type epoxy resin, liquid-phase bisphenol F type epoxy resin, solid-phase phenoxy resin, solvent mixture of methylethylketone and toluene are mixed for 3 hours at a constant temperature of 80° C. to obtain a homogeneous mixture. Then, using the same mechanical mixer, non-conductive particles and hardener are mixed. Then a film with constant thickness of 10~50 μm is made on a release paper film using doctor blade method.

Here, the film is left for one hour at 80° C. to remove the solvent and is mixed in a way that the hardener is 15~30 wt % of the epoxy resin and the non-conductive particle is 10~30 wt % of the whole NCA film. The non-conductive particle is added in order to lower the thermal expansion coefficient of NCA film.

The thickness of NCA film is decided upon the thickness of the bump formed, however, is made to be 10~50 μm so that bump with various sizes can be employed. It is desirable to add an epoxy resin adhesion enhanced layer with the thickness of 2~5 μm to both sides of NCA film so that the adhesive strength of the film is increased. In a case that large amounts of inorganic powder is contained in NCA film to lower thermal expansion coefficient, an adhesion layer between semiconductor chip and board may not function properly because the area of resin that has adhesive strength among the adhesion area of NCA film becomes smaller. Therefore, an adhesion enhanced layer in formed by lamination at both sides of the NCA film that has smaller thermal expansion coefficient. This adhesion enhanced layer also experiences hardening by heat during the thermo-compression process, making adhesion better by contacting the whole of semiconductor chip and organic board, therefore significantly enhancing the adhesive strength comparing with that of NCA film that contains non-conductive particle of single-layer (one side) structure, and has no effect on conductivity between bump of the chip and electrode of the board. Here, adhesion enhanced layer is comprised of the same elements with those of resin part except for non-conductive particle of the NCA film, and the thickness is just decreased to 2~5 μm.

Meanwhile, NCA paste is a lot simpler in its composition than those of NCA film. That is, 30~50 g of liquid-phase imidazole type hardener is mixed with 100 g of liquid-phase bisphenol A or F type epoxy resin and non-conductive particles SiO2 or SiC with the size of 0.1~1 μm is mixed 10~30 wt % to this NCA paste resin that is composed as above. Mixing process is to mix them until it becomes homogeneosus using mechanical mixer room temperature.

The components of the NCA paste are listed above in specifc weight amounts. The NCA paste is effective when the component materials are used in the following ranges of percentage weight of the film. The liquid-phase bisphenol A or F type epoxy resin can be 40–75 wt %. The liquid-phase imidazole type hardener can be 15–30 wt %. And the non-conductive SiO2 or SiC particles can be 10–30 wt %.

[Method for Flip Chip Bonding]

Figure 3:
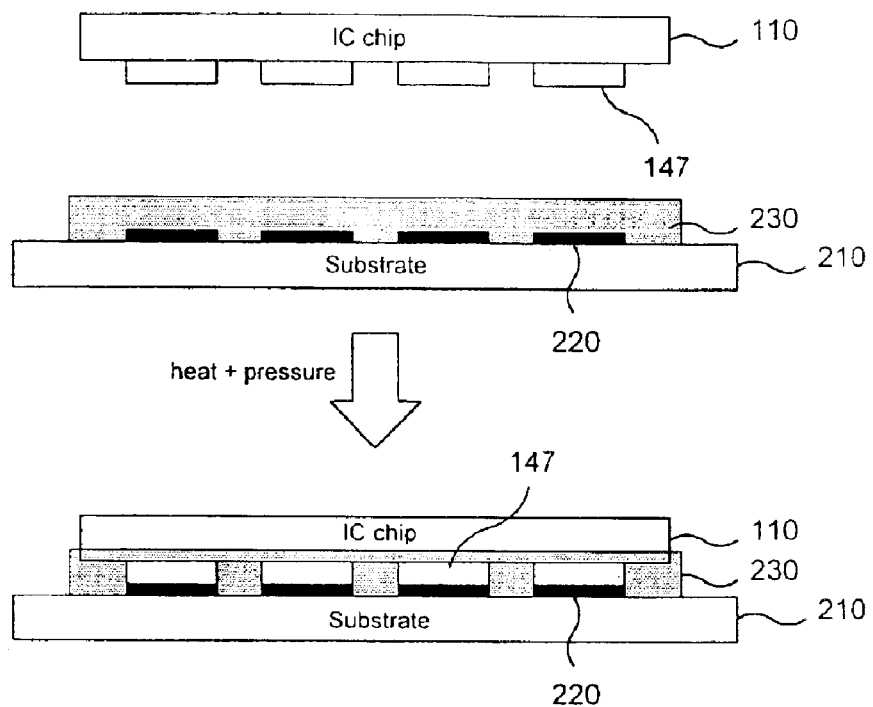
FIG. 3 is a sketch to explain the method for flip chip bonding in this invention.

Explanation on a method for flip chip bonding referring to FIG. 3 follows. First,in the case of NCA paste, IC chip 110 that a bump 147 is formed is aligned to metal electrode 220 after fixed amount of NCA paste 230 is coated to the board 210 using injection equipment or screen printer equipment. Here, bump 147 can be gold stud bump (140 of FIG. 1C) that has sharp end, or gold stud bump (140a of FIG. 1D) that has flat end, or non-electrolyte nickel/copper/gold bump (145 of FIG. 2D).

Since NCA paste 230 becomes hardened within 5 minutes, if IC chip 110 and board 210 is thermo-compressed under the pressure of 3~5 kgf/cm2 at 150° C., bump 147 is plastically deformed and is contacted with metal electrode 220, therefore, the bump 147 and the metal electrode 220 is stably connected mechanically and electrically as a result.

In the case of NCA film, after the side of NCA film is thermo-compressed to the board 210 under the pressure of 1~2 kgf/cm2 at 80° C., release paper film is removed, and electrode 220 of the board 210 and non-solder bump 147 of the chip 110 is connected using NCA film by the align process.

Figure 4A:
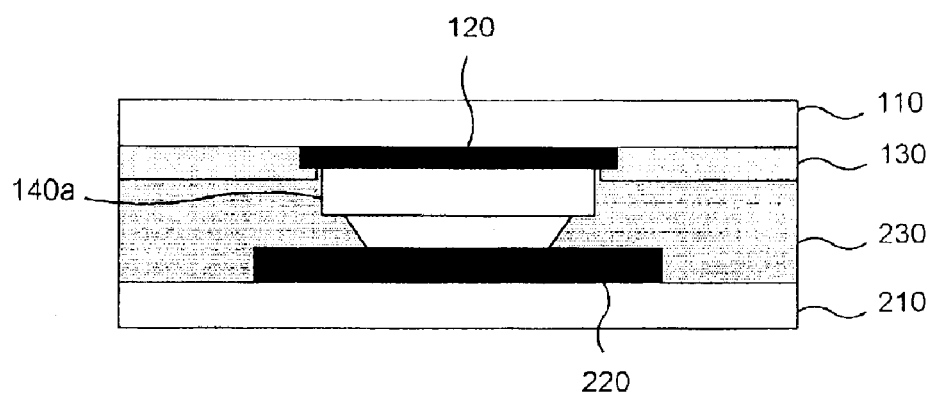
FIG. 4A and FIG. 4B are cross-sectional views to present the results of flip chip bonding for a case that gold stud bump and electroless nickel/copper/gold bump are applied.
Figure 4B:
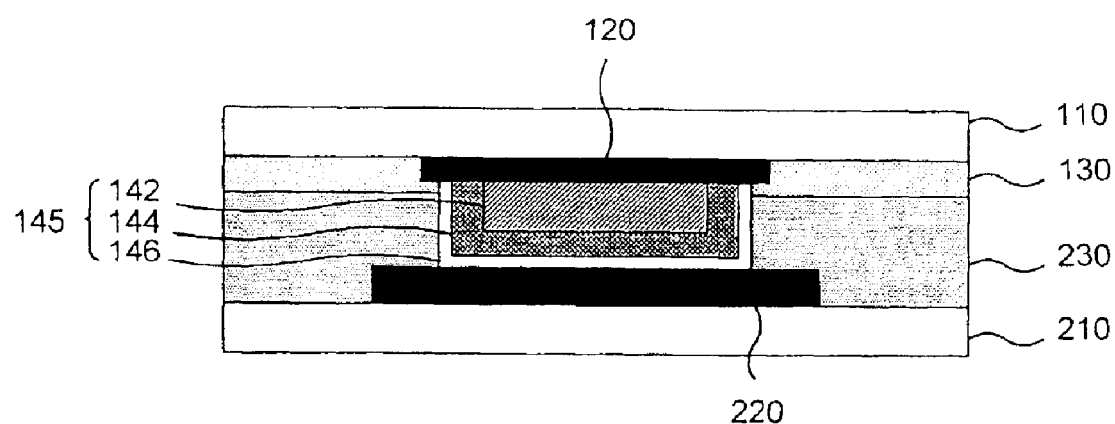

FIG. 4A and FIG. 4B are cross-sectional views to present the case of flip chip bonding by gold stud bump and electroless nickel/copper/gold bump, respectively.

INDUSTRIAL APPLICABILITY

NCA in the present invention has smaller coefficient of thermal expansion and dielectric constant and exhibits superior mechanical and electrical features as well as high reliability compared to conventional NCA. Also it is less expensive than ACA, unlike ACA, it does not contain high-priced conductive particles. Also it can be made in the form of a film and a paste, therefore, can be used appropriately as needed.

Since the flip chip bonding method in this invention uses non-solder bump it is environmentally friendly. This method is also highly competitive in cost and productivity since it can employ existing flip chip process and equipment that use polymer conductive adhesives. Also, contact resistance between IC chip and board is low since contact area is wide due to the bump designed to make high plastic deformation possible toward electrode that is formed on board.

Also, it is clear that the scope of the claim is not limited only to the compositions stated in the examples in the present invention and equally contains the combination of similar compositions.

Embodiments of the present invention are not limited only to the above, and it is evident that it can be diversely modified by a person who has ordinary knowledge in the appropriate field, within the technical idea of the present.

What is claimed is:

1. Non-conductive adhesive for flip chip bonding that is dried and has the form of a film, comprising:

6~10 wt % of solid-phase bisphenol A type epoxy resin;

15~25 wt % of liquid-phase bisphenol F type epoxy resin;

12~18 wt % of solid-phase phenoxy resin;

32~40 wt % of solvent mixture with methylethylketone and toluene with the ratio of 1:3 in vol %;

8~14 wt % of liquid-phase imidazole hardener; and

6~20 wt % of non-conductive SiO2 or SiC particles.

2. Non-conductive adhesive for flip chip bonding of claim 1, wherein the thickness of the film is 10~50 μm.

3. Non-conductive adhesive for flip chip bonding of claim 1, wherein an epoxy adhesion enhanced layer with the thickness of 2~5 μm, the epoxy adhesion enhanced layer being made by mixing 6~10 wt % of solid-phase bisphenol A type epoxy resin, 15~25 wt % of liquid-phase bisphenol F type epoxy resin, 12~18 wt % of solid-phase phenoxy resin, 32~40 wt % of solvent mixture with methylethylketone and toluene with the ration of 1:3 in vol %, and 8~14 wt % of liquid-phase imidazole hardener are contained and drying it.

4. Non-conductive adhesive for flip chip bonding of claim 1, wherein the non-conductive $SiO_2$ or SiC particles have a size of 0.1~1 μm.

5. Non-conductive adhesive for flip chip bonding of claim 1, wherein the hardener is 15~30 wt % to epoxy resin and the non-conductive particle is 10~30 wt % to the whole non-conductive adhesive.

6. Non-conductive adhesive for flip chip bonding that has the form of a paste, comprising:
- 40~75 wt % of liquid-phase bisphenol A or F type epoxy resin;
- 15~30 wt % of liquid-phase imidazole type hardener; and
- 10~30 wt % of non-conductive SiO2 or SiC particles.

7. Non-conductive adhesive for flip chip bonding of claim 6, wherein the non-conductive SiO2 or SiC particles have a size of 0.1~1 μm.

* * * * *

UNITED STATES PATENT AND TRADEMARK OFFICE
CERTIFICATE OF CORRECTION

PATENT NO.        : 6,930,399 B2
APPLICATION NO.   : 10/343519
DATED             : August 16, 2005
INVENTOR(S)       : Paik et al.

It is certified that error appears in the above-identified patent and that said Letters Patent is hereby corrected as shown below:

At column 1, line 21, please replace "than million cells" with --than a million cells--

At column 1, line 39, please replace "a existing" with --an existing--

At column 1, line 42, please replace "of a solder" with --the solder--

At column 1, line 42, please replace "of remained" with --the remaining--

At column 1, line 43, please replace "underfill and" with --underfill, and--

At column 2, line 8, please replace "also not" with --also is not--

At column 2, line 11, please replace "of large" with --of the large--

At column 2, line 23, please replace "with smaller" with --with a smaller--

At column 2, line 51, please replace "particle is" with --particles are--

At column 2, line 55, please replace "that multiple" with --on which multiple--

At column 2, line 56, please replace "that" with --on which--

At column 2, line 57, please replace "non conductive" with --non-conductive--

At column 2, line 57, please replace "one example" with --another--

At column 2, line 61, please replace "plastic" with --plastically--

At column 3, line 13, please replace "coining process" with --the coining process--

At column 3, line 14, please replace "is decided" with --is based--

At column 3, line 15, please replace "coining process" with --the coining process--

At column 3, line 16, please replace "stud bump, however" with --stud bump. However--

At column 3, line 16, please replace "is better to be added for copper stud bump."

UNITED STATES PATENT AND TRADEMARK OFFICE
CERTIFICATE OF CORRECTION

| | | |
|---|---|---|
| PATENT NO. | : 6,930,399 B2 | |
| APPLICATION NO. | : 10/343519 | |
| DATED | : August 16, 2005 | |
| INVENTOR(S) | : Paik et al. | |

It is certified that error appears in the above-identified patent and that said Letters Patent is hereby corrected as shown below:

with --the coining process is better for a copper stud bump.--

At column 3, line 61, please replace "to describe the method" with --showing the method--

At column 3, line 63, please replace "to describe" with --showing--

At column 3, line 64, please replace "even by coining" with --evened by a coining process--

At column 4, line 8, please replace "has a bit" with --has a--

At column 4, line 34, please replace "result" with --resulting--

At column 4, line 35, please replace "90°C." with --90°C--

At column 4, line 56, please replace "NAC" with --NCA--

At column 5, line 12, please replace "Mechanical" with --mechanical--

At column 5, line 16, please replace "80°C." with --80°C--

At column 5, line 20, please replace "blade" with --blade.--

At column 5, line 21, please replace "80°C." with --80°C--

At column 5, line 25, please replace "particle is" with --particles are--

At column 5, line 39, please replace "in formed" with --is formed--

At column 5, line 45, please replace "comparing" with --compared--

At column 5, line 47, please replace "particle" with --particles--

At column 5, line 48, please replace "adhesion enhanced" with --the adhesion enhanced--

UNITED STATES PATENT AND TRADEMARK OFFICE
CERTIFICATE OF CORRECTION

PATENT NO. : 6,930,399 B2
APPLICATION NO. : 10/343519
DATED : August 16, 2005
INVENTOR(S) : Paik et al.

It is certified that error appears in the above-identified patent and that said Letters Patent is hereby corrected as shown below:

At column 5, line 60, please replace "homogeneosus" with --homogeneous--

At column 6, line 4, please replace "that" with --on which--

At column 6, line 13, please replace "150°C." with --150°C--

At column 6, line 16, please replace "is stably" with --are stably--

At column 6, line 19, please replace "80°C." with --80°C--

In the abstract, line 18, please replace "to a form" with --in a form--

Signed and Sealed this

Twenty-sixth Day of September, 2006

JON W. DUDAS
*Director of the United States Patent and Trademark Office*